(12) United States Patent
Theil et al.

(10) Patent No.: US 6,396,118 B1
(45) Date of Patent: May 28, 2002

(54) CONDUCTIVE MESH BIAS CONNECTION FOR AN ARRAY OF ELEVATED ACTIVE PIXEL SENSORS

(75) Inventors: Jeremy A. Theil, Mountain View; Jane Mei-Jech Lin, San Jose; Min Cao; Gary W. Ray, both of Mountain View; Shawming Ma, Sunnyvale; Xin Sun, San Jose, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/496,941

(22) Filed: Feb. 3, 2000

(51) Int. Cl.[7] ............................................... H01L 31/00
(52) U.S. Cl. .................. 257/444; 257/458; 257/656; 257/290; 257/291; 257/59; 257/72
(58) Field of Search ................................. 257/656, 458, 257/444, 290, 291, 59, 72; 327/503; 438/48

(56) References Cited

U.S. PATENT DOCUMENTS

| | | | | |
|---|---|---|---|---|
| 4,745,451 A | * | 5/1988 | Webb et al. .................. 357/30 |
| 5,076,670 A | * | 12/1991 | Sayyah ........................ 359/72 |
| 5,235,195 A | * | 8/1993 | Tran et al. .................... 257/59 |
| 5,578,837 A | * | 11/1996 | Jackson et al. ............... 257/53 |
| 5,936,230 A | * | 8/1999 | Street .................. 250/214 VT |
| 5,936,261 A | * | 8/1999 | Ma et al. ...................... 257/59 |
| 6,018,187 A | * | 1/2000 | Theil et al. ................. 257/458 |
| 6,069,365 A | * | 5/2000 | Chow et al. ................ 250/551 |
| 6,215,164 B1 | * | 4/2001 | Cao et al. .................. 257/431 |
| 6,229,191 B1 | * | 5/2001 | Cao et al. .................. 257/444 |

FOREIGN PATENT DOCUMENTS

JP  04216670  * 8/1992 .................. 257/52

* cited by examiner

Primary Examiner—Eddie Lee
Assistant Examiner—Eugene Lee (57) ABSTRACT

An array of active pixel sensors includes a substrate. An interconnect structure is formed adjacent to the substrate. The interconnect structure includes a plurality of conductive vias. A plurality of photo sensors are formed adjacent to the interconnect structure. Each photo sensor includes a pixel electrode. Each pixel electrode is electrically connected to the substrate through a corresponding conductive yet. A I-layer is formed over each of the pixel electrodes. The array of active pixel sensors further includes a conductive mesh formed adjacent to the photo sensors. An inner surface of the conductive mesh is electrically and physically connected to the photo sensors, and electrically connected to the substrate through a conductive via. The conductive mesh providing light shielding between photo sensors thereby reducing cross-talk between the photo sensors. The conductive mesh includes apertures that align with at least one of the pixel electrodes of the photo sensors.

16 Claims, 6 Drawing Sheets

CONDUCTIVE MESH BIAS CONNECTION FOR AN ARRAY OF ELEVATED ACTIVE PIXEL SENSORS

FIELD OF INVENTION

This invention relates generally to photo diode active pixel sensors. In particular it relates to a conductive mesh bias connection for an array of elevated active pixel sensors which provides light shielding between the active pixel sensors.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

Figure 1:
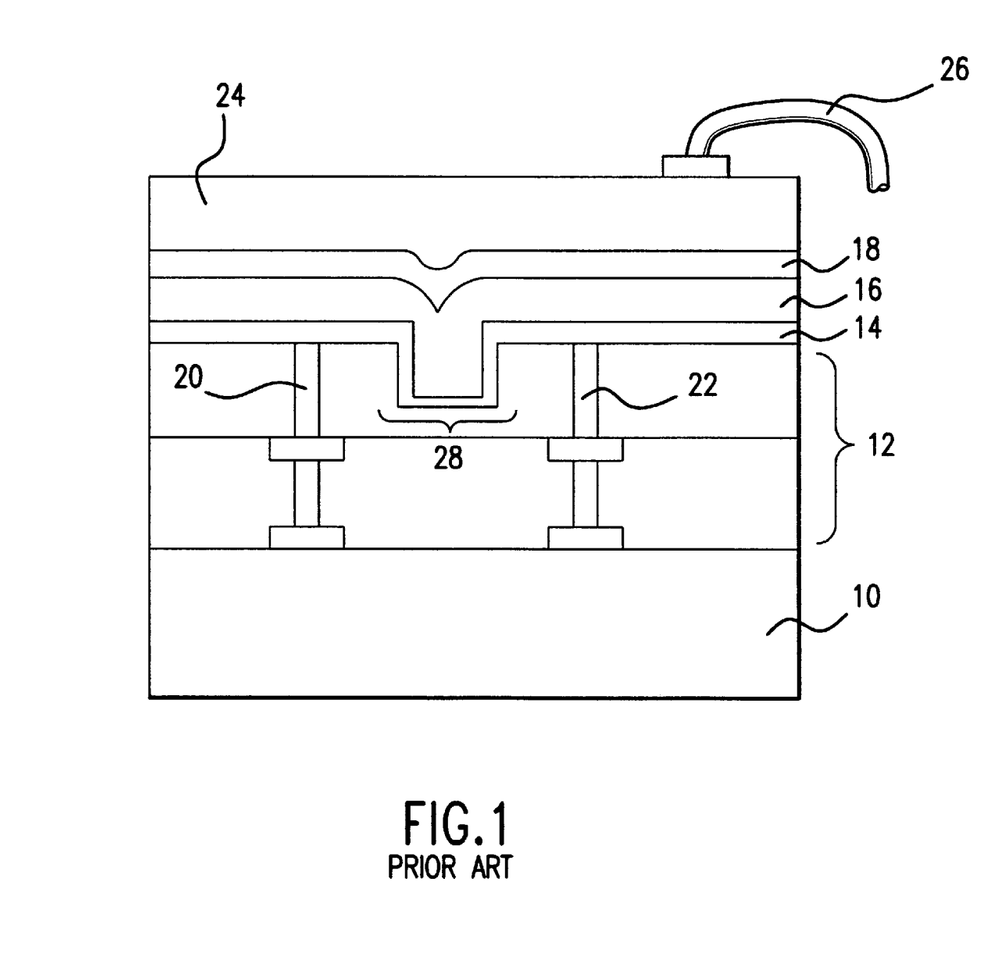
FIG. 1 shows a cross-section of a prior art array of image sensors.

FIG. 1 shows a cross-section of a prior art array of image sensors. This array of image sensors includes PIN diode sensors located over a substrate 10. An interconnection structure 12 electrically connects an N-layer 14 of the PIN diodes to the substrate 10. An I-layer 16 is formed over the N-layer 14. A P-layer 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A transparent conductive layer 24 is located over the array of diode sensors. A conductive lead 26 is connected to the transparent conductive layer 24. The conductive lead 26 is connected to a bias voltage which allows biasing of the P-layer 18 of the array of PIN diode sensors to a selected voltage potential.

A limitation of the image sensor structure of FIG. I is the lack of shielding between the image sensors. Light received by a given sensor is also received by a neighboring sensor because there is no shielding of light between neighboring sensors. Light received by a given image sensor will also effect neighboring image sensors because current can flow through the N-layer 14 between neighboring image sensors. Charge can flow between the image sensors especially when the light intensity of the received light varies greatly between neighboring image sensors. The P-layer 18, the I-layer 16 and the N-layer 14 are shared by neighboring image sensors. A trench 28 is formed to provide some isolation between the image sensors by increasing the resistance between the N-layers sections of neighboring image sensors.

Another limitation of the image sensor structure of FIG. 1 is the electrical connection between the conductive lead 26 and the transparent conductive layer 24. The transparent conductive layer 24 must be electrically conductive to allow biasing of the PIN diodes, and must be transparent to allow the PIN diodes to receive light. Generally, it is very difficult to bond to the types of materials that must be used to form the transparent conductive layer 24. Therefore, the conductive lead 26 must be attached to the transparent conductive layer 24 with the aid of some type of clamp or support structure. The result being an electrical connection which is not reliable and which is expensive to produce.

It is desirable to have an array of active pixel sensors formed adjacent to a substrate in which light received by an active pixel sensors of the array is shielded from the other active pixel sensors of the array. That is, it is desirable that isolation exist between the active pixel sensors which reduces the effect that light received by an active pixel sensor of the array has on the other active pixel sensors of the array. It is also desirable that the active pixel sensor array include a conductive layer that provides a bias voltage to the array of active pixel sensors, and that is reliably electrically connected to a pixel sensor bias voltage which originates on the substrate.

SUMMARY OF THE INVENTION

The present invention is an array of elevated active pixel sensors formed adjacent to a substrate that includes a conductive mesh that is reliably electrically connected to the pixel sensors and a pixel sensor bias voltage which is located on the substrate. The conductive mesh provides shielding of light received by each pixel sensor from the other pixel sensors. That is, the conductive mesh provides isolation between the active pixel sensors which reduces the effect that light received by an active pixel sensor of the array has on the other active pixel sensors of the array. The conductive mesh provides a bias voltage to the array of active pixel sensors. The substrate can be a CMOS substrate which includes image processing circuitry.

A first embodiment of this invention includes an array of active pixel sensors. The array of active pixel sensors includes a substrate. An interconnect structure is formed adjacent to the substrate. The interconnect structure includes a plurality of conductive vias. A plurality of photo sensors are formed adjacent to the interconnect structure. Each photo sensor includes a pixel electrode. Each pixel electrode is electrically connected to the substrate through a corresponding conductive via. An I-layer is formed over each of the pixel electrodes. The array of active pixel sensors further includes a conductive mesh formed adjacent to the photo sensors. An inner surface of the conductive mesh is electrically and physically connected to the photo sensors, and electrically connected to the substrate through a conductive via.

A second embodiment of this invention is similar to the first embodiment. The second embodiment includes the conductive mesh providing light shielding between photo sensors thereby reducing cross-talk between the photo sensors.

A third embodiment of this invention is similar to the second embodiment. The third embodiment includes apertures of the conductive mesh aligning with at least one of the pixel electrodes of the photo sensors.

A fourth embodiment of this invention is similar to the first embodiment, but further includes a P-layer formed between the I-layer and the conductive mesh. The inner surface of the conductive mesh is electrically connected to the P-layer and the interconnect structure.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in an array of elevated active pixel sensors formed adjacent to a substrate that includes a conductive mesh that is reliably electrically connected to the pixel sensors and a pixel sensor bias voltage which is located on the substrate. The conductive mesh provides shielding of light received each pixel sensor from the other pixel sensors. That is, the conductive mesh provides isolation between the active pixel sensors which reduces the effect that light received by an active pixel sensor of the array has on the other active pixel sensors of the array. The conductive mesh provides a bias voltage to the array of active pixel sensors.

Figure 2:
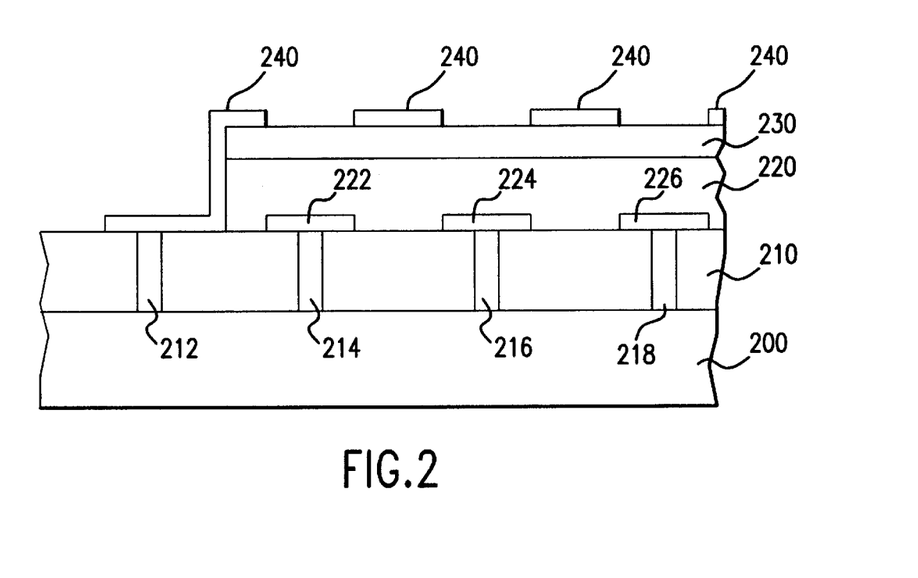
FIG. 2 shows an embodiment of the invention.

FIG. 2 shows a first embodiment of the invention. This embodiment includes a substrate 200. The substrate 200 includes electronic circuitry. An interconnection structure 210 is formed adjacent to the substrate 200. Pixel electrodes 222, 224, 226 are formed adjacent to the interconnection structure 210. Each pixel sensor of an array of pixel sensors includes an individual pixel electrode 222, 224, 226. An I-layer 220 is formed adjacent to the pixel electrodes 222, 224, 226. A P-layer 230 is formed adjacent to the I-layer 220. A conductive mesh 240 is formed adjacent to the P-layer 230. A first pixel electrode 222 of a first pixel sensor is electrically connected to the substrate 200 through a first conductive via 214. A second pixel electrode 224 of a second pixel sensor is electrically connected to the substrate 200 through a second conductive via 216. A third pixel electrode 226 of a third pixel sensor is electrically connected to the substrate 200 through a third conductive via 218. The conductive mesh 240 is electrically connected to the substrate 200 through a fourth conductive via 212.

Figure 3:
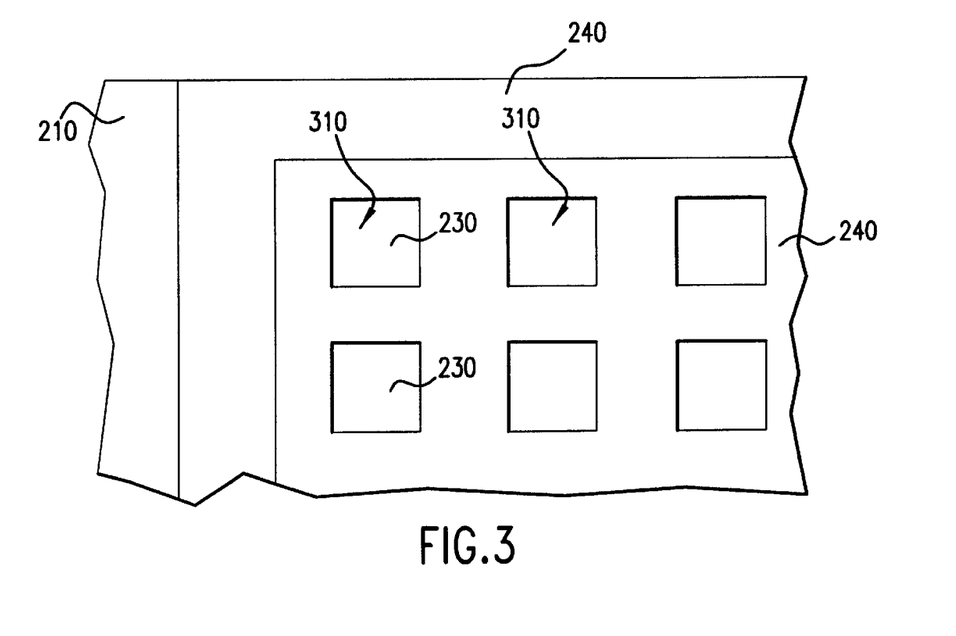
FIG. 3 shows a top view of an embodiment of the invention.

FIG. 3 shows a top-view of an embodiment of the invention. The top-view more clearly depicts the physical characteristics of the conductive mesh 240. The conductive mesh 240 include apertures 310 which align with the pixel electrodes 222, 224, 226 of the pixel sensors. The conductive mesh 240 provides shielding of light between the pixel sensors. The apertures 310 within the conductive mesh 240 allow light to be received by pixel sensors which align with the apertures 310 while shielding the received light from other pixel sensors.

The conductive mesh 240 is physically and electrically connected to the P-layer 230. The conductive mesh 240 is also electrically connected to the substrate 200 through the fourth conductive via. The conductive mesh 240 is driven to a bias voltage potential by electronic circuitry within the substrate 200. The bias voltage potential biases the pixel sensors.

The pixel sensors conduct charge when the pixel sensors receive light. The substrate 200 generally includes sense circuitry and signal processing circuitry. The sense circuitry senses how much charge the pixel sensors have conducted. The amount of charge conducted represents the intensity of light received by the pixel sensors. Generally, the substrate 200 can be CMOS (complementary metal oxide silicon), BiCMOS or Bipolar. The substrate 200 can include various types of substrate technology including charged coupled devices.

Typically, the interconnection structure 210 is a standard CMOS interconnection structure. The structure and methods of forming this interconnection structure 210 are well known in the field of electronic integrated circuit fabrication. The interconnection structure 210 can be a subtractive metal structure, or a single or dual damascene structure.

The conductive vias 214, 216, 218 pass through the pixel interconnect structure 210 and electrically connect the pixel electrodes 222, 224, 226 to the substrate 200. The fourth conductive via 212 passes through the pixel interconnect structure 210 and provides a reliable electrical connection between the conductive mesh 240 and the substrate 200. Typically, the conductive vias 212, 214, 216, 218 are formed from tungsten. Tungsten is generally used during fabrication because tungsten can fill high aspect ratio holes. That is, tungsten can be used to form narrow and relatively long interconnections. Typically, the conductive vias 212, 214, 216, 218 are formed using a chemical vapor deposition (CVD) process. Other materials which can be used to form the conductive vias 212, 214, 216, 218 include copper, aluminum or any other electrically conductive material.

The pixel electrodes 222, 224, 226 are generally formed from a doped semiconductor. The doped semiconductor can be an N-layer of amorphous silicon. The pixel electrodes 222, 224, 226 must be thick enough, and doped heavily enough that the pixel electrodes 222, 224, 226 do not fully deplete when biased during operation. The pixel electrodes 222, 224, 226 are typically doped with phosphorous.

The pixel electrodes 222, 224, 226 are typically deposited using plasma etched chemical vapor deposition (PECVD). The PECVD is performed with a phosphorous containing gas. The phosphorous gas can be $PH_3$. A silicon containing gas is included when forming amorphous silicon pixel electrodes.

An N-layer of amorphous silicon is typically used when forming the pixel electrodes 222 224, 226 of the PIN diode active pixel sensors. However, the diode active pixel sensors can include an NIP sensor configuration. In this case, the pixel electrodes 222. 224, 226 arc formed from a P-layer, and the P-layer 230 of FIG. 2 is replaced with an N-layer.

The I-layer 220 is generally formed from a hydrogenated amorphous silicon. The I-layer 220 can be deposited using a PECVD or a reactive sputtering process. The PECVD process must include a silicon containing gas. The deposition should be at a low enough temperature that hydrogen is retained within the film. The I-layer 220 is approximately one micron thick.

The P-layer 230 is generally formed from amorphous silicon. Typically, the P-layer 230 is doped with Boron. The P-layer 230 can be deposited using PECVD. The PECVD is performed with a Boron containing gas. The Boron containing gas can be $B_2H_6$. A silicon containing gas is included when forming an amorphous silicon P-layer 230. The P-layer 230 thickness must generally be controlled to ensure that the P-layer 230 does not absorb too much short wavelength (blue) light.

Another embodiment of the invention does not include a P-layer 230. The P-layer 230 can be eliminated with proper selection of the composition of the material within the conductive mesh 240, and proper selection of the doping levels of the pixel electrodes 222, 224, 226. For this embodiment, the conductive mesh 240 provides a conductive connection between a top surface of the I-layer 220 of the pixel sensors and the interconnection structure 210.

As previously described, the pixel electrodes 222, 224, 226, the I-layer 220 and the P-layer 230 are generally formed from amorphous silicon. However, the pixel electrodes 222, 224, 226, the I-layer 220 and the P-layer 230 can also be formed from amorphous carbon, amorphous silicon carbide, amorphous germanium, or amorphous silicon-germanium. It should be understood that this list is not exhaustive.

The conductive mesh 240 provides a conductive connection between the P-layer 230 and the interconnection structure 210. Light must pass through the apertures 310 of the conductive mesh 240 and is received by the pixel sensors. The conductive mesh 240 is formed from an opaque conductive material. Materials that can be used to form the conductive mesh 240 include indium tin oxide, aluminum, tungsten or copper. It is to be understood that this list is not exhaustive.

The conductive mesh 240 can be formed by depositing the conductive mesh material 240 by a sputtering process, and then etching the conductive mesh material according to a mesh pattern to form the conductive mesh 240. Deposition through sputtering and etching according to a pattern are well known in the art of integrated circuit fabrication.

Figure 4:
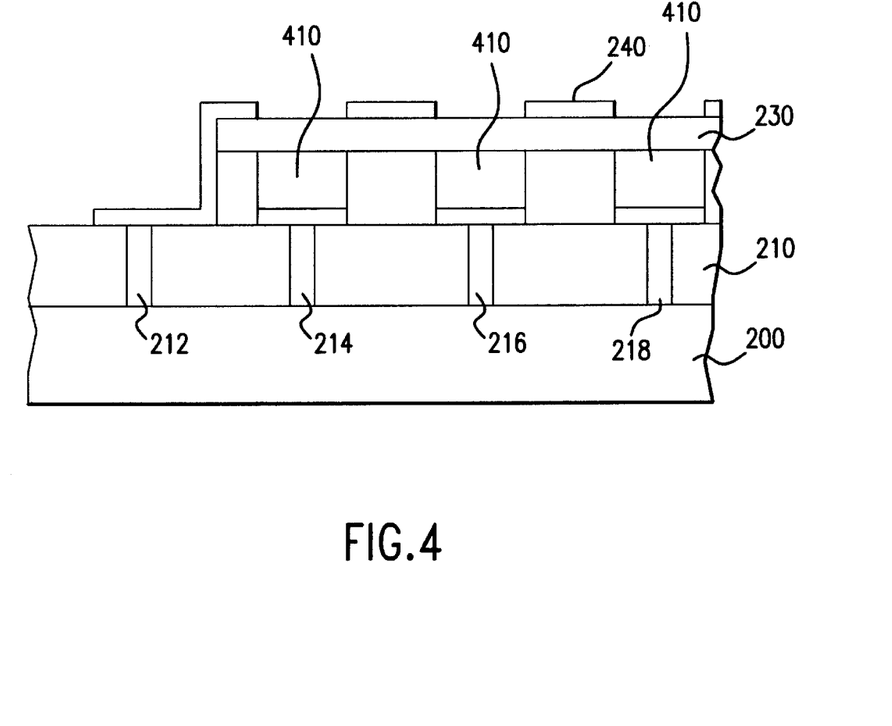
FIG. 4 shows another embodiment of the invention.

FIG. 4 shows another embodiment of the invention. This embodiment includes I-layer sections 410 rather than a single I-layer 220. That is, each pixel sensor includes a separate I-layer section 410 rather than a single I-layer 220 which is formed as a part of many pixel sensors. Like the pixel electrodes 212, 214, 216, the I-layer sections can be etched according to a predetermined pattern.

FIGS. 5–9 show processing steps which can be used to fabricate the embodiments shown in FIG. 2, FIG. 3 and FIG. 4.

Figure 5:
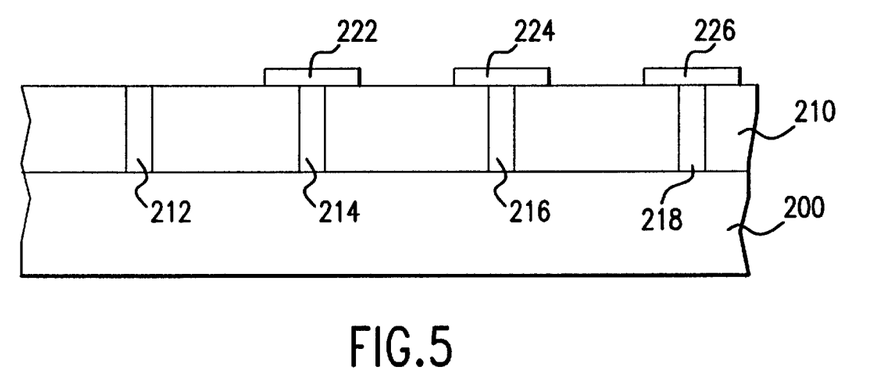
FIG. 5 shows pixel electrodes deposited on the pixel interconnect structure.

FIG. 5 shows a substrate 200 with an interconnection structure 210 formed over the substrate 200. Pixel electrodes 222, 224, 226 are formed over the interconnection structure 210. The structure and methods of forming this interconnection structure 210 are well known in the field of electronic integrated circuit fabrication. The interconnection structure 210 can be a subtractive metal structure, or a single or dual damascene structure.

The interconnection structure 210 includes conductive vias 212, 214, 216, 218 that are generally formed from tungsten. Tungsten is generally used because during fabrication, tungsten can fill high aspect ratio holes. That is, tungsten can be used to form narrow and relatively long interconnections. Typically, the conductive vias 212, 214, 216, 218 are formed using a chemical vapor deposition (CVD) process. Other materials which can be used to form the conductive vias 212, 214, 216, 218 include copper, aluminum or any other electrically conductive material.

The pixel electrodes 222, 224, 226 are deposited on the interconnection structure 210. A pixel electrode layer is first deposited over the interconnection structure 210. Then the pixel electrode layer is etched according to a predetermined pattern forming the pixel electrodes 222, 224, 226. An individual pixel electrode 222, 224, 226 is formed for each pixel sensor. The pixel electrodes 222, 224, 226 can be implemented with N-layer sections. Alternatively, the pixel electrodes 222, 224, 226 can be implemented with a conductive nitride, like, titanium nitride.

The pixel electrodes 222, 224, 226 arc typically deposited using PECVD. The PECVD is performed with a phosphorous containing gas. The phosphorous containing gas can be $PH_3$. A silicon containing gas, such as $Si_2H_6$ or $SiH_4$, is included when forming amorphous silicon pixel electrodes. The predetermined pixel electrode pattern is formed through a wet or dry etch of the deposited pixel electrode material.

Figure 6:
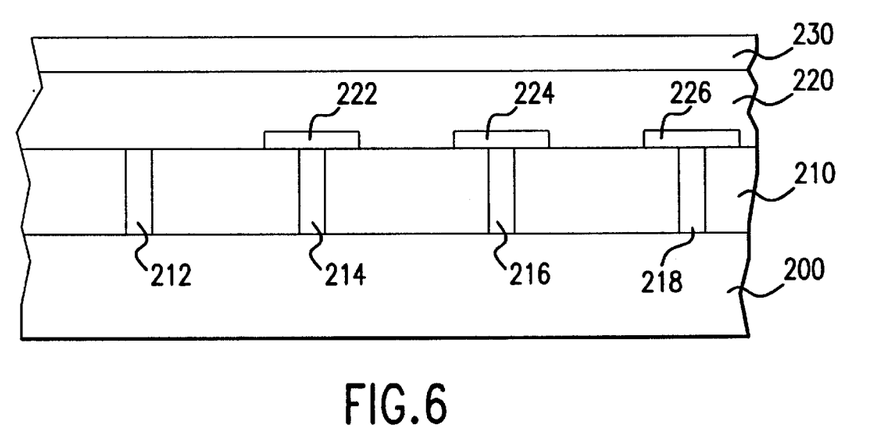
FIG. 6 shows an I-layer and a P-layer deposited over a plurality of pixel electrodes.

FIG. 6 shows an I-layer 220 and a P-layer 230 deposited over the plurality of pixel electrodes 222, 224, 226. The I-layer 220 is generally deposited using a PECVD or reactive sputtering process. The PECVD must include a silicon containing gas. The deposition should be at a low enough temperature that hydrogen is retained within the film. The P-layer 230 can also be deposited using PECVD. The PECVD is performed with a Boron containing gas. The Boron containing gas can be $B_2H_6$. A silicon containing gas is included when forming an amorphous silicon P-layer 230.

Figure 7:
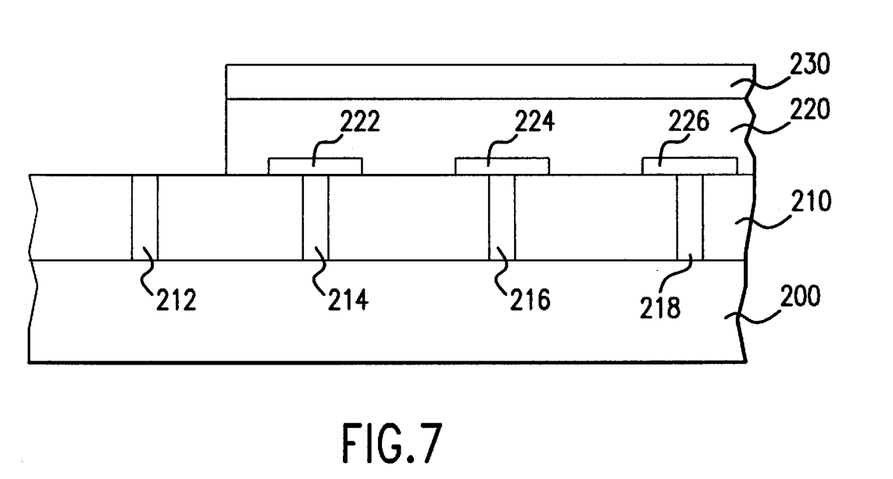
FIG. 7 shows the P-layer and the I-layer selectively etched to allow access to a conductive via.

FIG. 7 shows the P-layer 230 and the I-layer 220 having been etched to provide access to the fourth conductive via 212. The fourth conductive via 212 is electrically connected to a reference voltage on the substrate 200 which is used to bias the array of pixel sensors.

Figure 8:
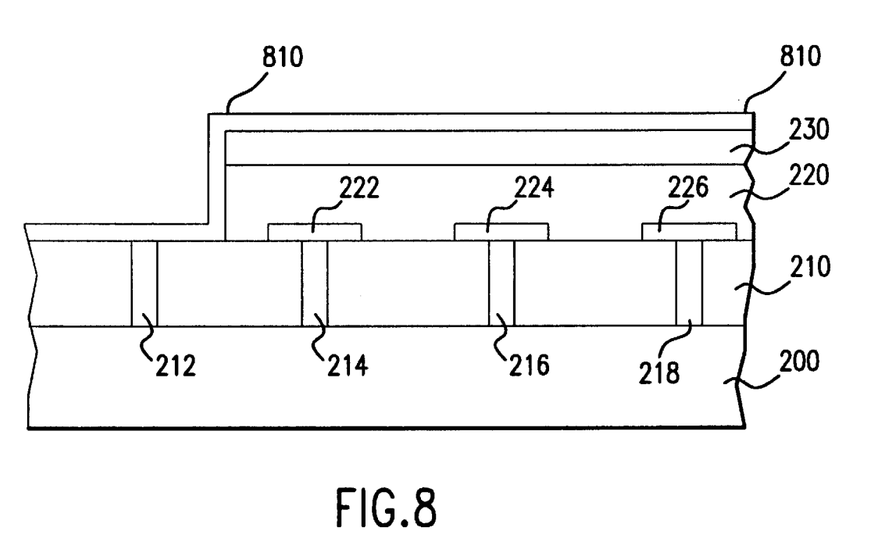
FIG. 8 shows a conductive layer deposited over the P-layer which provides an electrical connection between the P-layer and the interconnection structure.

FIG. 8 shows a conductive layer 810 deposited over the P-layer 230 which provides an electrical connection between the P-layer 230 and the fourth conductive via 212. The conductive layer 810 is formed from an opaque conductive material. Materials that can be used to form the conductive layer 810 include aluminum, tungsten or copper. It is to be understood that this list is not exhaustive.

The conductive layer 810 is generally deposited through reactive sputtering. However, the conductive layer 810 can also be grown by evaporation, or deposited through chemical vapor deposition or plasma vapor deposition.

Figure 9:
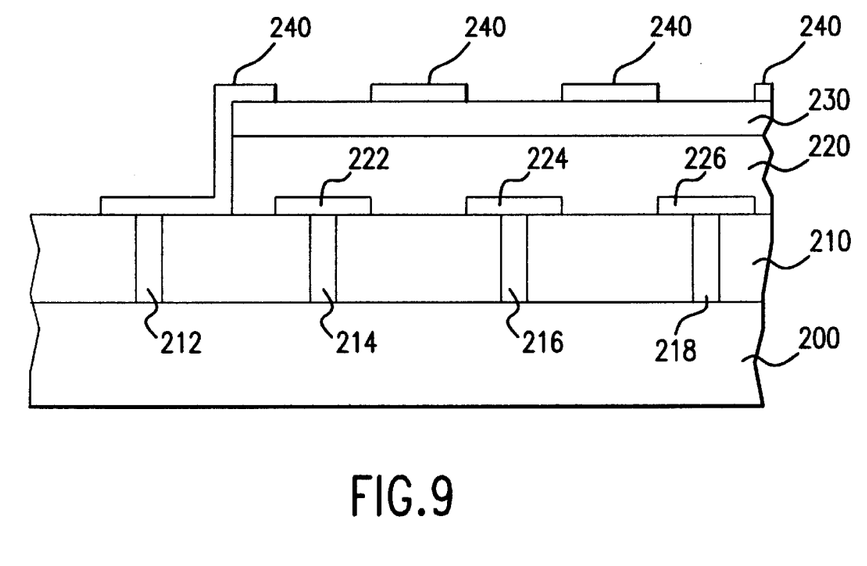
FIG. 9 shows the transparent conductive layer having been etched according to a predetermined pattern.

FIG. 9 shows the conductive layer 810 having been etched according to a predetermined pattern forming the conductive mesh 240. Etching of conductive materials is well known in the art of semiconductor processing.

Although specific embodiments of the invention have been described and illustrated, the invention is not to be limited to the specific forms or arrangements of parts so described and illustrated. The invention is limited only by the claims.

What is claimed:

1. An array of active pixel sensors comprising:
   a substrate;
   an interconnect structure adjacent to the substrate, the interconnect structure comprising, a plurality of conductive vias;

a plurality of photo sensors adjacent to the interconnect structure, each photo sensor comprising:
   a pixel electrode, the pixel electrode electrically connected to the substrate through a corresponding conductive via;
   an I-layer formed over the pixel electrode;
the array of active pixel sensors further comprising:
   a conductive mesh formed adjacent to the photo sensors, an inner surface of the conductive mesh electrically and physically connected to the photo sensors, and electrically connected to the substrate through a conductive via.

2. The active pixel sensor as recited in claim 1, wherein the conductive mesh provides light shielding between sensors thereby reducing cross-talk between the sensors.

3. The active pixel sensor as recited in claim 1, wherein the conductive mesh comprises apertures in which each aperture aligns with at least one of the pixel electrodes of the photo sensors.

4. The active pixel sensor as recited in claim 1, wherein each pixel electrode comprise an N-layer.

5. The active pixel sensor as recited in claim 1, wherein the interconnection structure electrically interconnects the pixel electrodes to the substrate.

6. The photo diode active pixel sensor as recited in claim 1, wherein the I-layer and the pixel electrodes each comprise amorphous silicon.

7. The photo diode active pixel sensor as recited in claim 1, further comprising a P-layer formed between the I-layer and the conductive mesh, the inner surface of the conductive mesh physically connected to the P-layer, the I-layer, and electrically connected to the substrate through a conductive via.

8. The photo diode active pixel sensor as recited in claim 7, wherein the P-layer comprises amorphous silicon.

9. The photo diode active pixel sensor as recited in claim 1, wherein the inner surface of the conductive mesh is electrically connected to the substrate through a tungsten plug.

10. The photo diode active pixel sensor as recited in claim 1, wherein the conductive mesh comprises indium tin oxide.

11. The photo diode active pixel sensor as recited in claim 1, wherein the substrate comprises CMOS.

12. The photo diode active pixel sensor as recited in claim 1, wherein the substrate comprises active circuits which sense charge accumulated by the photo sensors due to the photo sensors receiving light.

13. The photo diode active pixel sensor as recited in claim 1, wherein the substrate comprises charge coupled devices.

14. The photo diode active pixel sensor as recited in claim 1, wherein the inner surface of the conductive mesh is electrically connected to the substrate through a plurality of tungsten plugs.

15. The active pixel sensor as recited in claim 1, wherein each pixel electrode comprise a P-layer.

16. The active pixel sensor as recited in claim 1, wherein each pixel electrode comprise an conductive metal.

* * * * *